United States Patent [19]

Picquendar et al.

[11] 4,013,896
[45] Mar. 22, 1977

[54] HIGH-SPEED LOGIC GATE WITH TWO COMPLEMENTARY TRANSISTORS AND SATURABLE RESISTORS

[75] Inventors: Jean-Edgar Picquendar; Pham Ngu Tung, both of Paris, France

[73] Assignee: Thomson-CSF, Paris, France

[22] Filed: Oct. 15, 1975

[21] Appl. No.: 622,611

[30] Foreign Application Priority Data

Oct. 18, 1974 France .............................. 74.35145

[52] U.S. Cl. .................. 307/214; 307/215; 307/288; 307/213; 307/205

[51] Int. Cl.² ................ H03K 19/08; H03K 19/40; H03K 19/34

[58] Field of Search .......... 307/255, 284, 288, 304, 307/215, 214, 213, 205

[56] References Cited

UNITED STATES PATENTS

| | | | |
|---|---|---|---|
| 3,302,041 | 1/1967 | Poston .............................. | 307/305 |
| 3,376,431 | 4/1968 | Merrell .......................... | 307/288 X |
| 3,456,131 | 7/1969 | Adem ............................. | 307/305 X |
| 3,508,081 | 4/1970 | Matsuda ......................... | 307/288 X |
| 3,660,687 | 5/1972 | Sahm et al. ..................... | 307/255 X |
| 3,891,866 | 6/1975 | Okuhara et al. ................ | 307/305 X |

*Primary Examiner*—John S. Heyman
*Attorney, Agent, or Firm*—Cushman, Darby & Cushman

[57] ABSTRACT

A novel high-speed logic gate of compact design, having low energy consumption comprises a plurality of components each constituted by two complementary transistors and saturable resistors integrated upon one in the same substrate. The base of the first transistor has for its base a portion of the collector of a second transistor, and for its collector the base of the second transistor. The second transistor has its base diffused into its emitter into its base.

6 Claims, 10 Drawing Figures

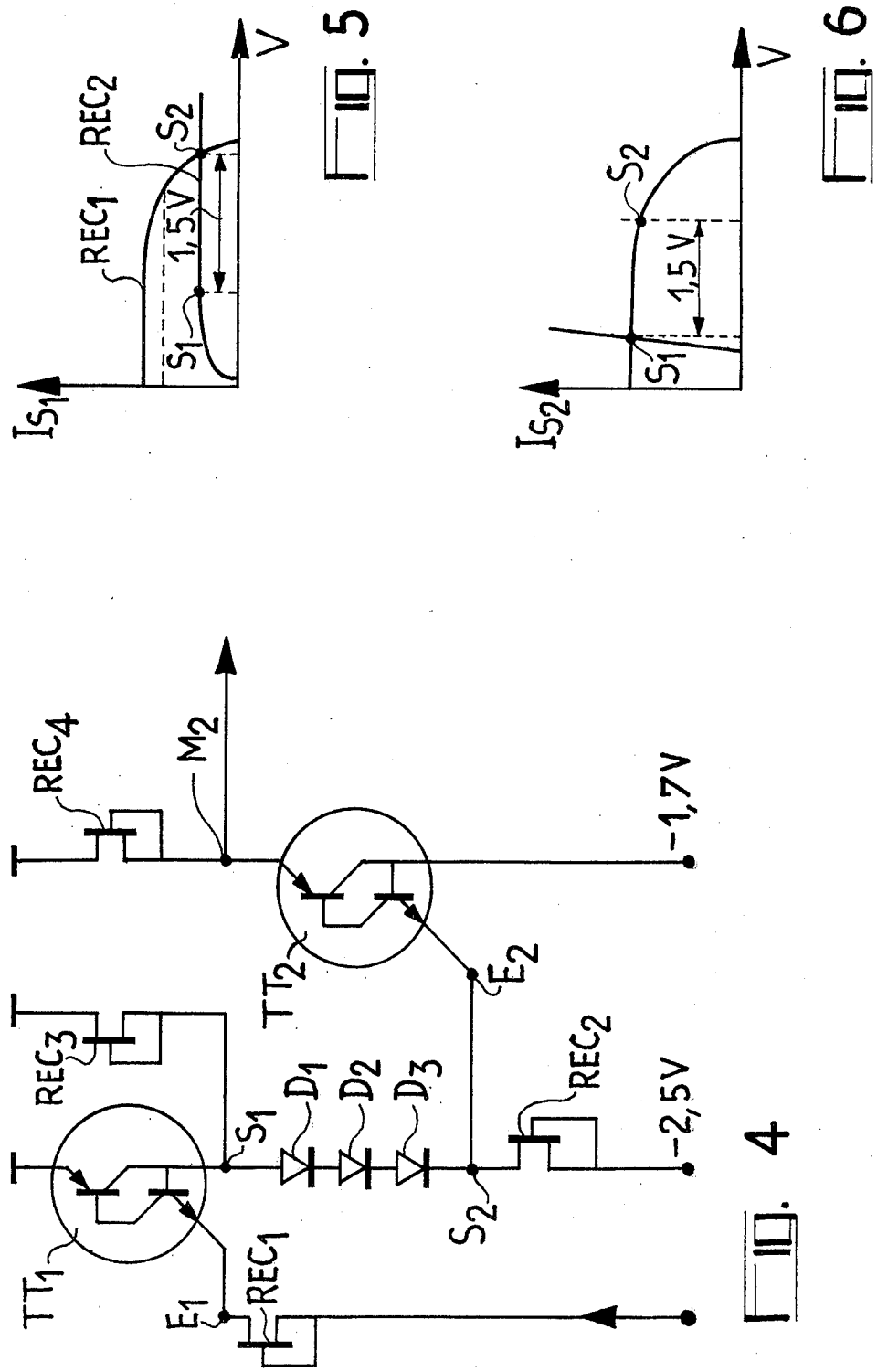

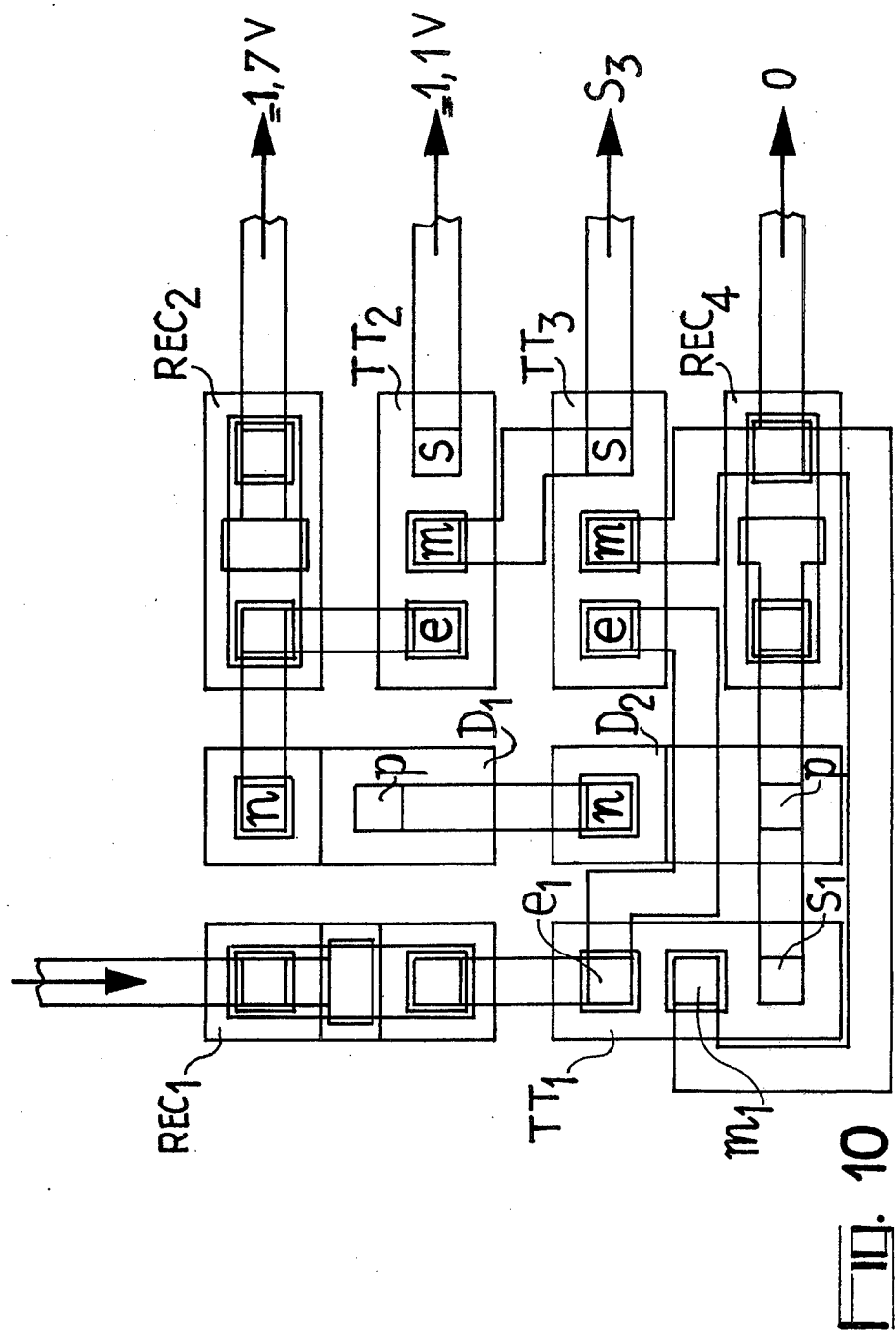

HIGH-SPEED LOGIC GATE WITH TWO COMPLEMENTARY TRANSISTORS AND SATURABLE RESISTORS

The gates used in logic circuits have characteristics which are matched to said logic circuits. It is often difficult to match them to other logic circuits.

Moreover, the majority of the known gates are bulky, dissipate too much power and often have too low a switching speed.

The object of the present invention is a novel family of gates utilising the component which formed the object of a copending Patent Application under Ser. No. 572,918.

The gate in accordance with the invention comprises at least one component of the aformentioned type, in which one of the electrodes in the terminal zones thereof is at a fixed potential, whilst the other is connected either to a fixed voltage source or earthed across a saturable resistor.

The invention will be better understood from a consideration of the ensuing description given with reference to the attached drawings in which:

FIG. 4 illustrates the diagram of a second embodiment;

FIGS. 5 and 6 are sets of explanatory graphs;

FIG. 10 is the integration diagram of the device shown in FIG. 9.

Figure 1:
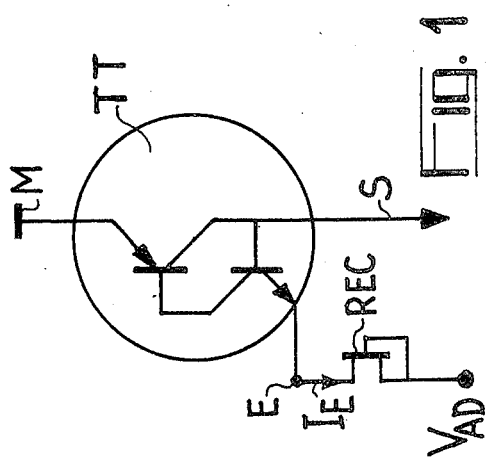
FIG. 1 illustrates the diagram of a first embodiment of the invention.

FIG. 1 illustrates a component of the kind described in the aforementioned Patent Application, which comprises two complementary pnp and npn transistors and which will be designated hereinafter by the initials TT. This component has three input electrodes, the grounded input M (emitter of the pnp transistor), the input E (collector of the npn transistor) and the input S (base of the npn transistor). The input E is connected across a field-effect transistor REC, whose source and drain are connected together, to the address input to which a two level $V_{ad}$ voltage is applied.

The successive layers of the component TT have the indicated polarities and the voltage $V_{AD}$ can acquire two negative levels, one of small absolute value, substantially equal to 0, the other of the order of −1.5 v.

If $V_{AD}$ is sufficiently high in terms of absolute value, the pnp and npn transistors go conductive.

The potential difference $V_S - V_E$ for the components TT of the kind disclosed in the indicated Patent Application, is of the order of 0.5 v. $V_S$ is of the order of $V_M$ i.e. −0.1 v; or the order of −0.1 v.

Figure 2:
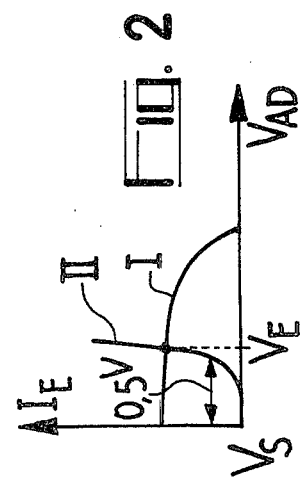
FIG. 2 is an explanatory graph.

FIG. 2 plots $I_E$ as a function of $V_{AD}$. The graph I represents the current in the component REC which behaves as a saturable resistor. The graph II illustrates the current $I_E$ at the point E, coming from the component TT. The equilibrium current is given by the intersection between the two graphs. The addressing voltages are therefore such that $V_{AD} < V_S - 0.5$. If $V_S$ is between −0.1 and 1 v., then $V_{AD}$ must be smaller than 1.6 v.

Figure 3:
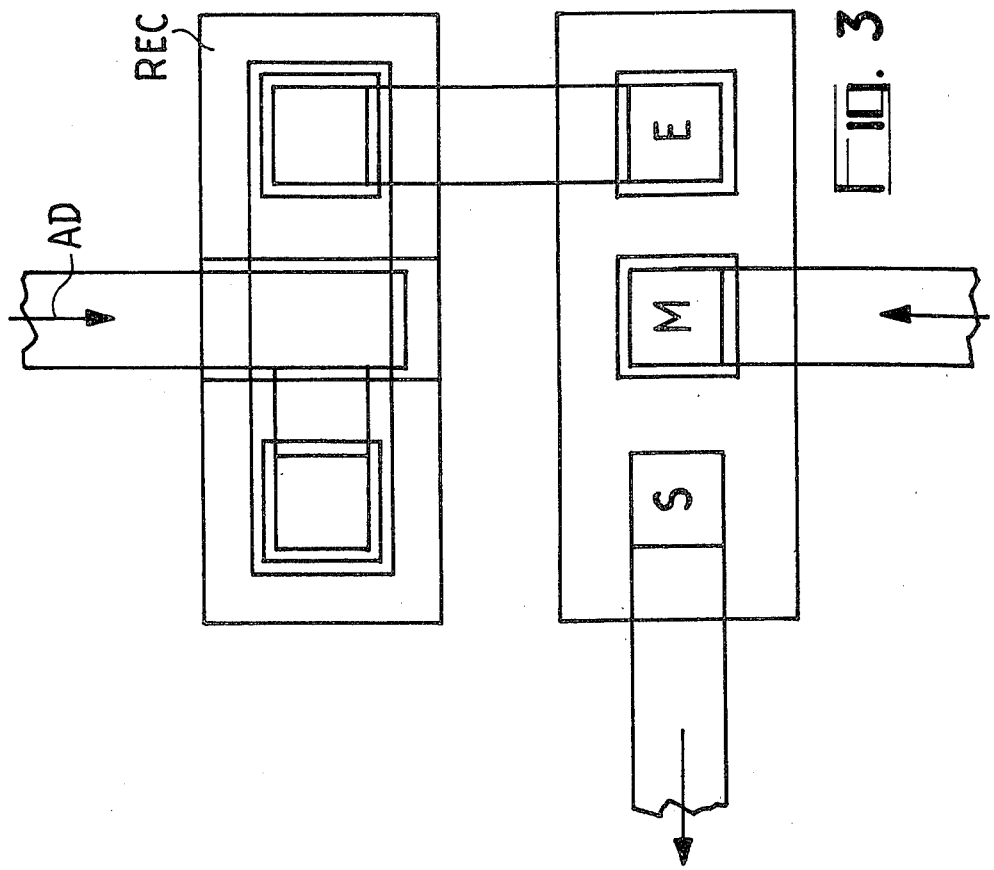
FIG. 3 is a plan view of the integrated circuit whose equivalent circuit diagram is shown in FIG. 1.

In FIG. 3, the gate has a size of 5 × 5 microns square. The function of REC is to limit the input current $I_E$ which must nevertheless be sufficient to cause the unit to change from the blocked to the conductive state.

The values of the currents in one or the other of the two states of the gate can be summarised as follows:

| State | $V_{AD}$ | $I_E$ | $I_S$ |
|---|---|---|---|
| blocked | 0 | 0 | 0 |
| addressed | −1.5v | −3μA | −3β.μA |

$β$ being the current gain of the component TT.

FIG. 4 illustrates a power inverter gate. It comprises two components $TT_1$, $TT_2$. The input terminal $E_1$ of the component $TT_1$ is supplied across a saturable resistor $REC_1$ with an address voltage having two levels −0.1 v or −1.6 v. The terminal $S_1$ is connected across three series-connected diodes $D_1$, $D_2$, $D_3$, to the terminal $S_2$ of the component $TT_2$. This terminal $S_2$ is connected by a saturable resistor to a voltage source producing −2.5 v. The component $TT_2$ has a terminal $M_2$ which is the output terminal of the system and a terminal S at the potential −1.7 v. The terminal $M_2$ is earthed across a saturable resistor $REC_4$. The terminal $S_1$ is earthed across a saturable resistor $REC_3$. The terminal $M_1$ is earthed.

The operation of the system is as follows:

The potential difference $V_{S1} - V_{S2}$ is constant and depends upon the potential drop across the terminals of the set of three diodes, which is of the order of 1.5 v when these are conducting. In other words, $V_{S1}$ and $V_{S2}$ are substantially constant whatever the state of the system. Thus (FIGS. 5 and 6) the resistor $REC_2$ will have the same characteristic.

When the component $TT_1$ is blocked (zero address voltage) the potential at $S_2$ is given by the point of intersection between the characteristics of $REC_3$ and $REC_2$ (FIG. 5). The potential at $S_1$ is equal to −2.4 + 1.5 v = 0.9 v.

When the component $TT_1$ is conductive, the potential at $S_1$ is close to earth potential, namely −0.1 v. The potential at $S_2$ is equal to −0.1 v −1.5 v = −1.6 v.

In the first case, the component $TT_1$ is conductive. In the second case, it is blocked.

The various voltages are summarised in the following table:

| $V_{In}$ | $V_{E1}$ | $V_{S1}$ | $V_{S2}$ | $V_{M2}$ | |
|---|---|---|---|---|---|
| −0.1 | −0.1 | −0.9 | −2.4 | −1.6 | High state |
| −1.6 | −0.8 | −0.1 | −1.6 | 0 | Low state |

The high state can be used for the addressing of storage cells.

When these cells are addressed, and if they number n, then if E is the current drawn by each cell the following condition must obtain:

$I_{output} = n\, E_1$ however $I_{output} = β_2\, I_{E2} = β_2 β_1\, I_{E1}$  $β_2$ and $β_1$ being the respective gains of $TT_2$ and $TT_1$.

However $β_2 ≅ 10$ and $β = IS_1/I_{E1}$

It is simply necessary to make $10\, I_{S1}/E > n$

Figure 7:
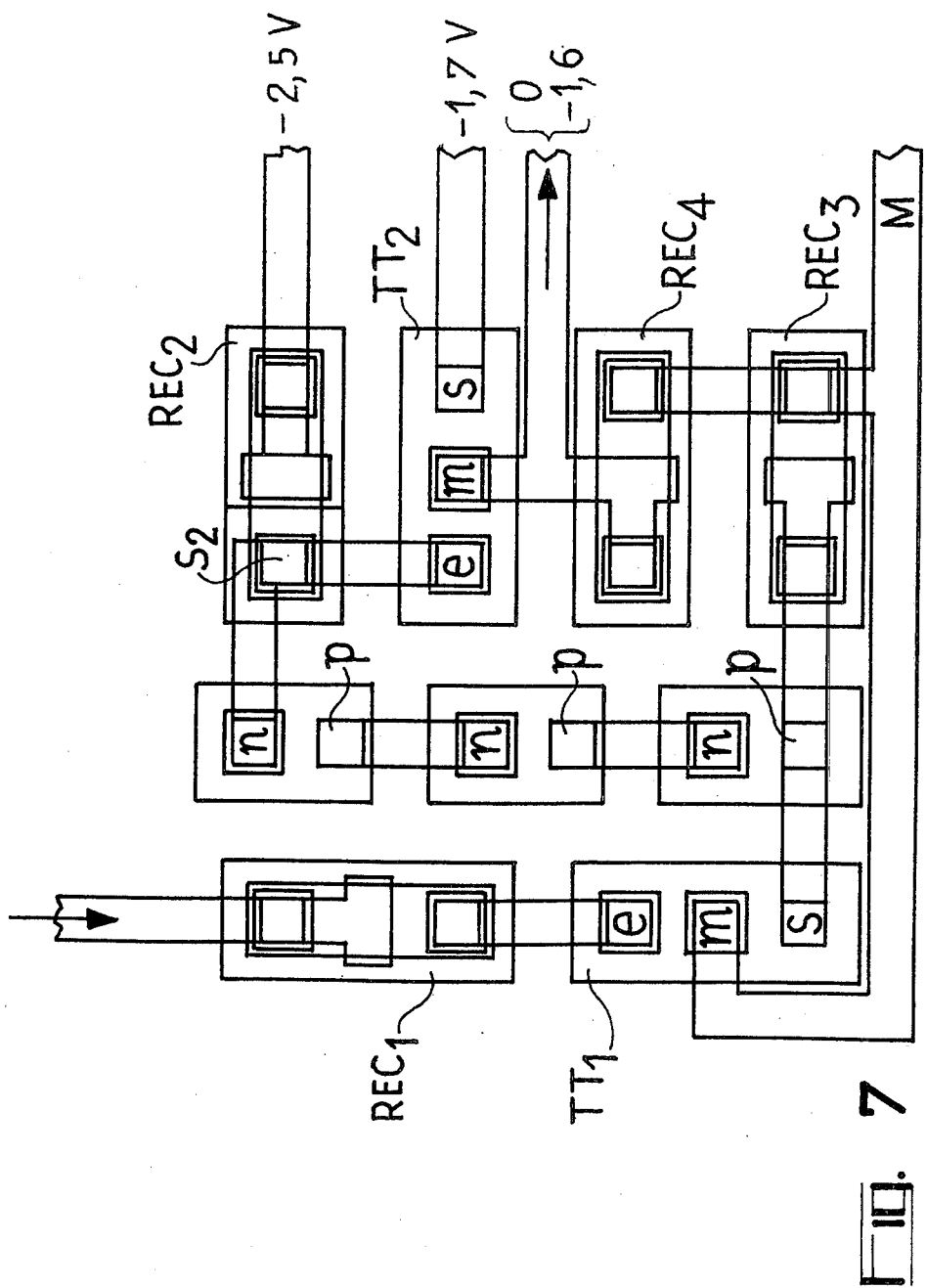
FIG. 7 is the integration diagram of the device shown in FIG. 4.

FIG. 7 illustrates a plan view of the integration diagram of the gate. Its dimensions are 12 × 24 microns square. The maximum current drawn at the input is 15 microamps at −1.6 v. The maximum internal consumption is 15 microamps.

Figure 8:
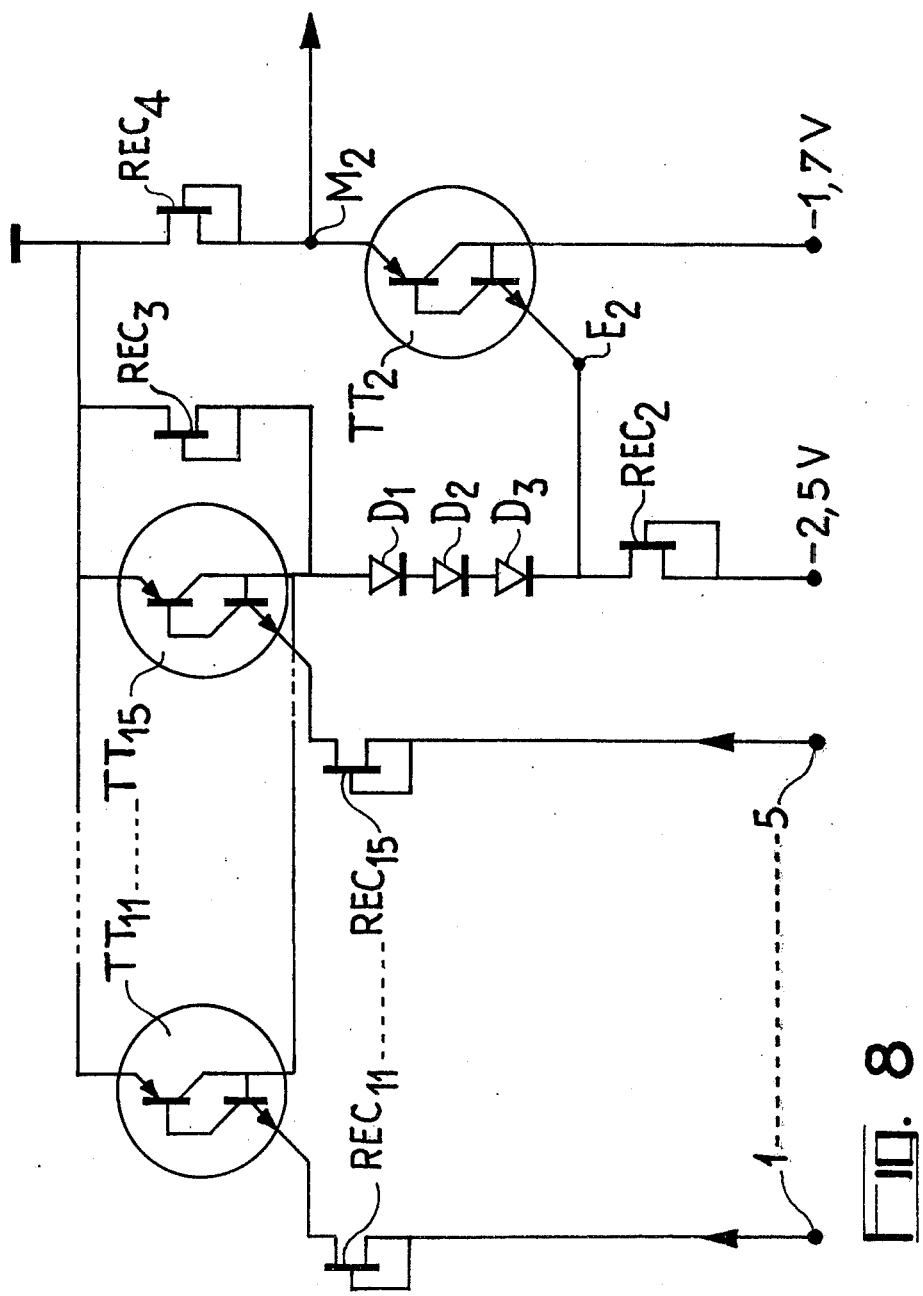
FIG. 8 is a variant embodiment of the device shown in FIG. 4.

From this gate, it is possible to derive a NOR-gate having as many inputs as required. FIG. 8 illustrates a NOR-gate with five inputs. In this figure, the component $TT_1$ is replaced by five components $TT_{11}$ to $TT_{15}$ arranged in parallel across the terminal $M_1$ and connected to address inputs respectively across saturable resistors $REC_{11}$ to $REC_{15}$.

Figure 9:
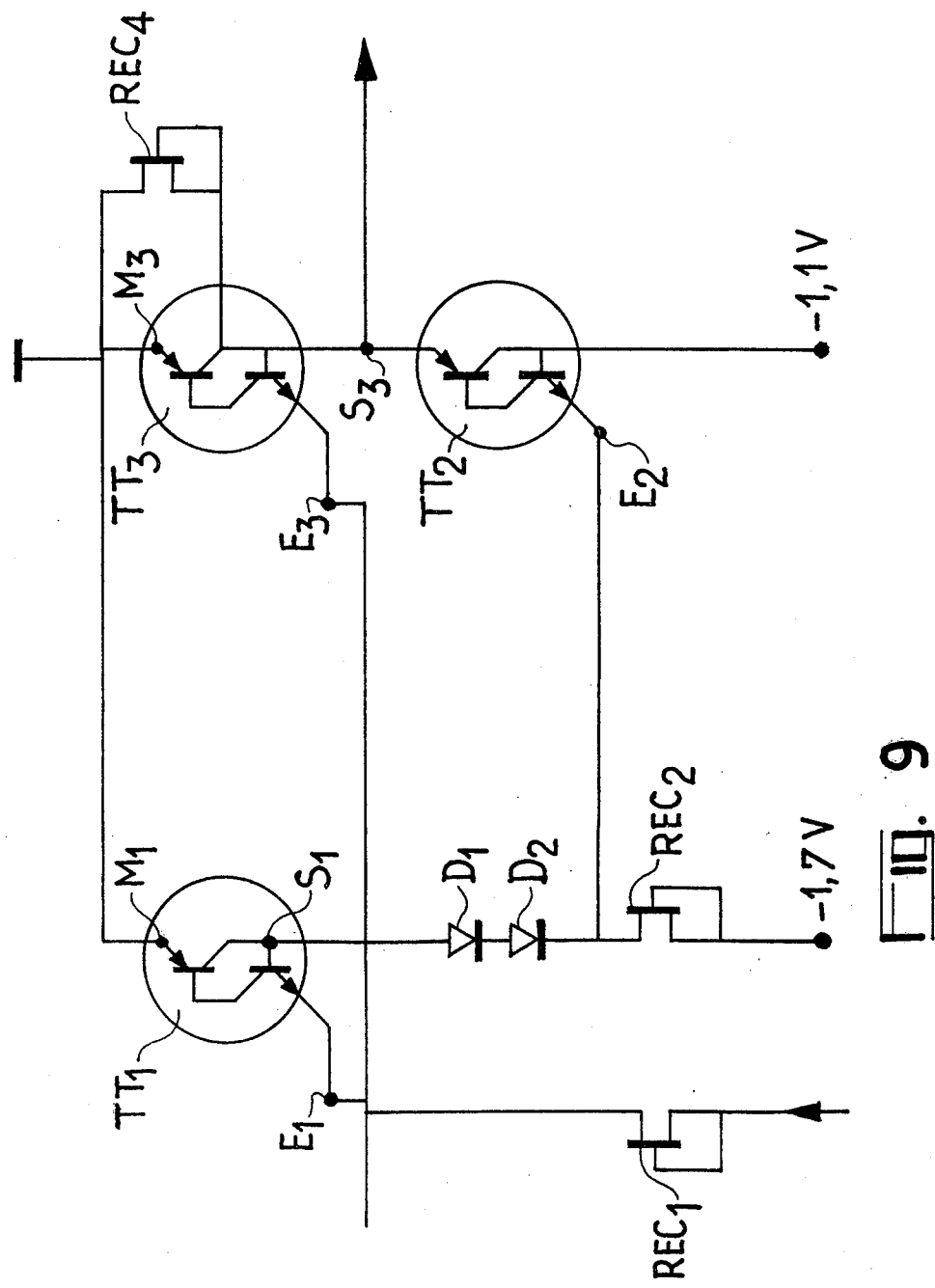
FIG. 9 is a diagram of a third embodiment.

FIG. 9 illustrates a write-in inverter gate. This gate has three components $TT_1$, $TT_2$, $TT_3$.

The terminal $E_1$ of the component $TT_1$ is connected across a saturable resistor $REC_1$ to a generator producing the signal (not shown). This signal is a voltage having two negative levels which can acquire one value close to 0 v., the 0 state, and another, lower value, of the order of −1 v., the 1 state. The terminal of transistor $TT_1$ is earthed. The terminal $S_1$ is connected to a source producing a negative voltage of the order of −1.7 v., through the medium of two diodes $D_1$ and $D_2$ connected in series in the forward direction from earth to the negative voltages, and of a saturable resistor $REC_2$.

The component $TT_3$ has its terminal $M_3$ earthed, its input $E_3$ being connected to the input $E_2$; a resistor $REC_4$ is connected between $M_3$ and the collector of the first transistor of TT, its terminal $S_3$, which latter is the output terminal of the system. The component $TT_2$ has its terminal M taken to $S_3$, its terminal $S_2$ placed at −1.1 v and its terminal $E_2$ taken to the input of the load resistor $REC_2$.

The operation of the system is as follows:

a. With the input $E_1$ in the 0 state, the component $TT_1$ is blocked. $E_1$ and $E_3$ being at the same potential and the transistor $TT_3$ likewise, the component $TT_2$ is conductive and $S_3$ is at a potential of around 1 v.

b. The input $E_1$ is in the 1 state and the transistor $TT_1$ is conductive as also is the component $TT_3$. The output $S_3$, or the output of the system, is virtually at earth potential. The transistor $TT_2$ is blocked.

The integration diagram of the system shown in FIG. 9 has been illustrated in FIG. 10.

What we claim is:

1. A logic gate comprising: first and second solid state components, each component comprising first and second complementary transistors integrated upon one and the same substrate and having respective emitters, bases and collectors, the first transistor having for its base a portion of the collector of said second transistor, and for its collector, the base of said second transistor, said second transistor having its base diffused into its collector, and its emitter into its base, said components having each a first, a second and a third terminal, connected respectively to the emitter of said first transistor, to the base of said second transistor and to the emitter of said second transistor, said first terminals having first connections to ground, said second terminal of said first component having a second connection to ground, and a fixed voltage dropper for connection to the second terminal of said second component, means for connecting a two level voltage to said third terminal of said first component, and second and third connections for connecting to fixed d.c. voltages said second and said third terminal of said second component.

2. A gate as claimed in claim 1, wherein said first terminal of said first component is directly connected to ground, a first saturable resistor connecting said second component to first terminal to ground.

3. A gate as claimed in claim 2, wherein a second saturable resistor connects said second terminal of said first component to said two level voltage source, a third saturable resistor connects the third terminal of said first component to ground, and a fourth saturable resistor connects said third terminal of said second component to said first d.c. source.

4. A gate as claimed in claim 3, wherein said saturable resistors are field effect transistors having interconnected drains and sources respectively.

5. A gate as claimed in claim 4, comprising a plurality of first components having their first and third terminals connected respectively in parallel, and their second terminals connected respectively to two level voltage sources.

6. A gate as claimed in claim 4, further comprising a third component identical to the first and said second component, having its first terminal grounded, its second terminal bridge connected between the first terminal of said second component and ground, the connection to the ground comprising a saturable resistor, and its third terminal connected to the first terminal of said first component.

* * * * *